United States Patent
Matumoto

[11] Patent Number: 6,165,899
[45] Date of Patent: Dec. 26, 2000

[54] METHOD FOR MANUFACTURING SEMICONDUCTOR DEVICES HAVING DUAL DAMASCENE STRUCTURE

[75] Inventor: Akira Matumoto, Tokyo, Japan

[73] Assignee: NEC Corporation, Tokyo, Japan

[21] Appl. No.: 09/178,813

[22] Filed: Oct. 26, 1998

[30] Foreign Application Priority Data

Oct. 31, 1997 [JP] Japan ............................... 9-299839

[51] Int. Cl.[7] ............................................. H01L 21/4763
[52] U.S. Cl. ........................... 438/638; 438/623; 438/725
[58] Field of Search ............................ 438/618, 640, 438/638, 673, 725, 623

[56] References Cited

U.S. PATENT DOCUMENTS

| | | |
|---|---|---|
| 4,789,648 | 12/1988 | Chow et al. |
| 4,944,836 | 7/1990 | Beyer et al. |
| 5,559,055 | 9/1996 | Chang et al. |
| 5,677,243 | 10/1997 | Ohsaki .................................. 438/638 |
| 5,705,430 | 1/1998 | Avanzino et al. |
| 5,920,790 | 7/1999 | Wetzel et al. ........................... 438/618 |

*Primary Examiner*—Caridad Everhart
*Attorney, Agent, or Firm*—Young & Thompson

[57] ABSTRACT

A first insulating film is formed on a semiconductor substrate. On the first insulating film, a first photoresist is then formed. A pattern for contact hole is formed in the first photoresist. Thereafter, the first insulating film is etched by using the first photoresist as a mask, and thereby a contact hole is formed. The first photoresist is then removed, and an organic insulating film is formed on a whole surface. In addition, a second insulating film is formed on the organic insulating film. Subsequently, a second photoresist is formed on the second insulating film. A pattern for wiring trench is formed in the second photoresist. Thereafter, the second insulating film is etched by using the second photoresist as a mask. Subsequently, the organic insulating film is etched by using the second insulating film as a mask, and thereby a wiring trench is formed.

16 Claims, 6 Drawing Sheets

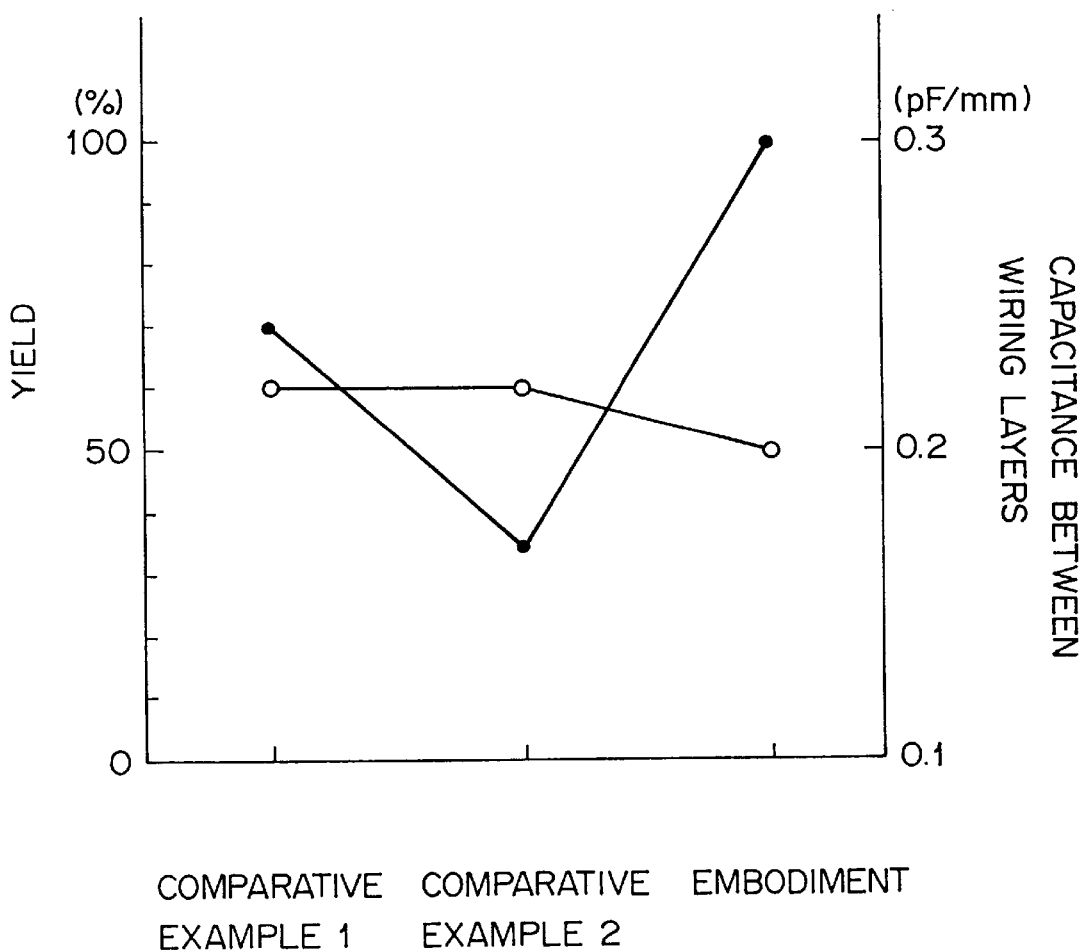

METHOD FOR MANUFACTURING SEMICONDUCTOR DEVICES HAVING DUAL DAMASCENE STRUCTURE

BACKGROUND OF THE INVENTION

1. Field of the Invention

The present invention relates to a method for manufacturing semiconductor devices having a dual damascene structure, and in particular to a method for manufacturing semiconductor devices having a dual damascene structure with high dimension precision.

2. Description of the Related Art

When forming a wiring layer in typical conventional methods for manufacturing semiconductor devices, a wiring metal layer is formed on the entire surface of a semiconductor substrate and thereafter a photoresist having the shape of a wiring pattern is formed. Thereafter, the wiring metal layer is etched by using the photoresist as an etching mask.

In recent semiconductor devices requiring finer patterns, however, resorting to only etching of the wiring metal layer causes a difficulty in production.

By way of example, therefore, there has been proposed a method of etching an insulating film formed in a region in which a wiring pattern should be formed, thereby forming a trench, embedding a wiring metal layer in the trench, and thereby forming a wiring layer (U.S. Pat. No. 4,944,836).

Furthermore, as a method developed from the above described method, there has been proposed a method of conducting formation of via holes for connecting underlying elements to a wiring layer in succession in a self-aligned manner, embedding a metal layer in the via holes and wiring trenches at the same time, and thereby forming via plugs and the wiring layer (U.S. Pat. No. 4,789,648). According to this method, processes can be shortened, and in addition failures due to pattern misalignment caused at the time of exposure of the via holes and the wiring trenches are suppressed. This method is called dual damascene method, and it has become a technique regarded as important in future semiconductor device manufacturing methods.

On the other hand, as different problems result upon fabrication of finer patterns, such as a lowering in signal transmission speed and occurrence of crosstalk caused by parasitic capacitance between adjacent wiring layers. As a countermeasure against these problems, a structure having an insulating film of a low permittivity between wiring layers is typically adopted. As such an insulating film of a low permittivity, a coated organic film, a coated inorganic film, a silicon oxide film containing fluorine, and an amorphous carbon film containing fluorine are being studied. In particular, the organic insulating film is extremely low in dielectric constant, and is a promising material.

Therefore, the above dual damascene method and the application of the organic insulating film are considered as necessary techniques in manufacture field of semiconductor device in the future.

FIG. 1 is a sectional view showing a conventional semiconductor device manufacturing method using a typical dual damascene method. On the surface of a Si substrate 300, a device isolation region 301 is formed. On the Si substrate 300, there are stacked in order a first etching stopper 302, a first interlayer insulating film 303, a second etching stopper 304, a second interlayer insulating film 305, and a photoresist 306 are stacked. A contact hole 307 is formed through a stacked body formed by them.

In this conventional manufacturing method using the dual damascene method, the contact hole 307 is formed by etching as described above, and thereafter exposure and etching of a photoresist (not shown) are conducted to form a wiring trench. For conducting the etching of the contact hole 307, it is necessary to conduct etching of the second interlayer insulating film 305, the second etching stopper 304, the first interlayer insulating film 303, and the first etching stopper 302 in order. In total, therefore, four etching processes are needed. In the case where the contact hole 307 is formed so as to extend to the device region and the device isolation region 301, as shown in FIG. 1, in a semiconductor device having high integration, the first etching stopper 302 functions to prevent a silicon oxide film in the device isolation region 301 from being etched.

For example, if silicon oxide films are used as the first and second interlayer insulating films 303 and 305 and silicon nitride films are used as the first and second etching stoppers 302 and 304, etching of the silicon oxide films is conducted, for example, by using $CHF_3$ gas having a flow rate of 20 sccm and Ar gas having a flow rate of 580 sccm, setting the substrate temperature to 10° C., and setting the bias power to 25 W. Furthermore, etching of the silicon nitride films is conducted, for example, by using $CF_4$ gas having a flow rate of 20 sccm, $H_2$ gas having a flow rate of 20 sccm, and Ar gas having a flow rate of 560 sccm, setting the substrate temperature to 10° C., and setting the bias power to 25 W.

FIG. 2 is a sectional view showing a conventional semiconductor device manufacturing method using a dual damascene method disclosed in U.S. Pat. No. 4,789,648. On a Si substrate 401, there are stacked in order a first etching stopper 402, a first interlayer insulating film 403, and a second etching stopper 404. On the second etching stopper 404, a second interlayer insulating film 405 with a trench is provided. Furthermore, there is provided an anti-reflection coated film 408 embedded in the trench and covering the surface of a second interlayer insulating film 405. On the anti-reflection coated film 408, a patterned photoresist 406 is formed.

In this conventional manufacturing method using the dual damascene method, a fine pattern is formed in the photoresist by exposure for forming the contact hole. Therefore, preceding the contact hole, the wiring trench is formed as described above. Thereafter, the anti-reflection coated film 408 is embedded in the wiring trench, and flatting is conducted. Subsequently, the photoresist for forming the contact hole is subjected to exposure. When conducting etching to form the contact hole, this anti-reflection coated film 408 is also etched.

FIGS. 3A and 3B are sectional views showing a conventional semiconductor device manufacturing method using a dual damascene method disclosed in U.S. Pat. No. 4,944,836 in the order of process. As shown in FIG. 3A, a first etching stopper 501, a first interlayer insulating film 502, a patterned second etching stopper 503, a second interlayer insulating film 504, and a patterned photoresist 505 are stacked on a Si substrate 500 in order. Thereafter, wiring trenches 506 and a via hole 507 are formed as shown in FIG. 3B.

In this conventional manufacturing method using the dual damascene method, the photoresist 505 and the second etching stopper 503 are patterned. Therefore, the number of processes of etching for forming the wiring trench 506 and the via hole 507, i.e., contact-etching having a high aspect ratio is reduced. Furthermore, as compared with the above described two examples of the conventional technique, the contact hole can be formed more easily.

In the semiconductor device manufacturing method using the typical dual damascene method shown in FIG. 1, however, it is necessary to conduct over-etching as compared with the typical film thickness in the process of etching the silicon oxide film or the silicon nitride film, by taking the dispersion in the manufacture into consideration. At this time, etching in the lateral direction or deposition takes place. Therefore, it is extremely difficult to control the dimensions of the contact hole. Especially in such a dual damascene method, the film thickness etched to form the contact hole becomes the sum of the film thickness etched by using the conventional method and the film thickness of the insulating film. Therefore, the aspect ratio of the contact hole becomes extremely large. As a result, the etching of a fine contact hole is much more difficult.

In the semiconductor device manufacturing method using the dual damascene method shown in FIG. 2, the trench is formed previously before the exposure of the contact hole. In order to form a fine pattern by the exposure, however, it is necessary to embed the anti-reflection coated film in the trench and conduct flatting. In the contact hole etching process, therefore, an extra process of etching the anti-reflection coated film is needed. In addition, it is difficult to form a fine contact hole in this manufacturing method as well.

On the other hand, in the semiconductor device manufacturing method using the dual damascene method shown in FIGS. 3A and 3B, etching with a large number of processes is not required for forming the contact hole of high aspect ratio. As compared with the above described two examples of the conventional technique, therefore, the contact hole can be formed easily. However, it is necessary to make the etching rate of the second etching stopper equal to or less than one twentieth of the etching rate of the first interlayer insulating film and the second interlayer insulating film. If a film such as a silicon nitride film or a silicon oxide film is used, the control of the depth of the wiring trenches including a fine trench becomes extremely difficult. As a result, the margin in the manufacture is narrow and the yield is extremely low.

SUMMARY OF THE INVENTION

An object of the present invention is to provide a method for manufacturing a semiconductor device having a dual damascene structure capable of forming contact holes, via holes or wiring trenches each having a high aspect ratio with high dimension precision.

A method for manufacturing a semiconductor device having a dual damascene structure according to the present invention comprises the steps of forming a first insulating film on a semiconductor substrate having a device region at surface thereof, and forming a first photoresist on the first insulating film. Next, a pattern for contact hole or via hole is formed in the first photoresist by using an exposure method. Thereafter, the first insulating film is etched by using the first photoresist as a mask, and thereby a contact hole or a via hole for providing the device region with electrical conduction is formed. The first photoresist is then removed, and an organic insulating film is formed on a whole surface. In addition, a second insulating film is formed on the organic insulating film. Subsequently, a second photoresist is formed on the second insulating film. A pattern for wiring trench is formed in the second photoresist by using an exposure method. Thereafter, the second insulating film is etched by using the second photoresist as a mask. Subsequently, the organic insulating film is etched by using the second insulating film as a mask, and thereby a wiring trench is formed. A conductive layer is embedded in the contact hole or the via hole and the wiring trench.

According to the present invention, the number of processes in the etching process is reduced. With a high dimension precision, a contact hole and a via hole each having a high aspect ratio can be formed. In addition, since an organic insulating film is used, the difference in etching rate from other insulating films serving as masks becomes large and a large margin can be ensured. As a result, the yield can be significantly improved, and the parasitic capacitance between wiring layers can be reduced. Therefore, the operation speed of the semiconductor device can be increased.

BRIEF DESCRIPTION OF THE DRAWINGS

FIG. 6 is a graphic diagram showing measurement results of the yield and the parasitic capacitance between wiring layers of semiconductor devices fabricated by various methods.

DETAILED DESCRIPTION OF THE PREFERRED EMBODIMENTS

Hereafter, methods for manufacturing a semiconductor device according to embodiments of the present invention will be described concretely by referring to appended drawing. FIGS. 4A to 4I are sectional views showing a method for manufacturing a semiconductor device according to a first embodiment of the present invention in the order of process.

Figure 4A:
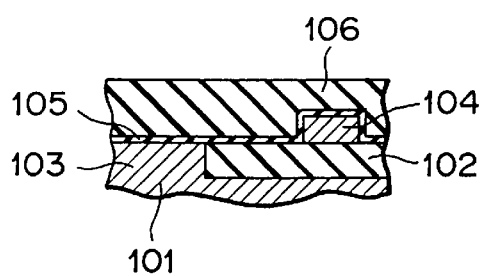
FIGS. 4A to 4I are sectional views showing a method for manufacturing a semiconductor device according to a first embodiment of the present invention in the order of process.

In the first embodiment, a diffusion layer 103 having a device region (not shown) including a wiring layer is first formed at a surface of a silicon substrate 101 as shown in FIG. 4A. Subsequently, a device isolation region 102 including a silicon oxide film is selectively formed at a surface of the diffusion layer 103. Thereafter, a polycrystalline silicon layer 104 is formed selectively on the device isolation region 102. As a first insulating film serving as an etching stopper, a silicon nitride film 105 having a film thickness of, for example, 500 Å is formed by using the chemical vapor deposition method (CVD). Furthermore, as a second insulating film, a BPSG (Boron-doped Phospho-Silicate Glass) film 106 having a film thickness of, for example, 2 μm is formed on the silicon nitride film 105 by using the CVD method. Thereafter, the surface of the BPSG film 106 is flatted by using the chemical-mechanical polishing method until the total film thickness on the diffusion layer 103 becomes, for example, 1 μm.

Figure 4B:
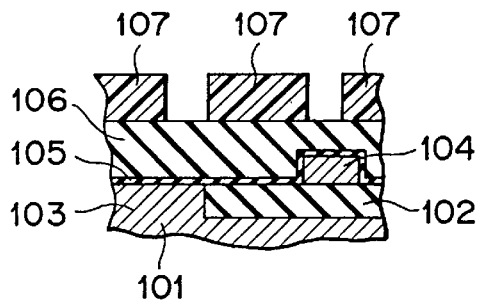

Subsequently, as shown in FIG. 4B, a first photoresist 107 is formed on the BPSG film 106. A pattern for contact hole is formed in the first photoresist 107 by using the ordinary exposure method.

Figure 4C:
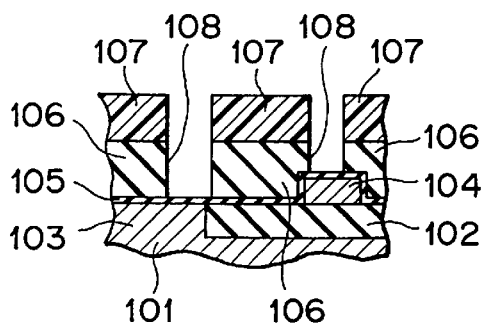

Subsequently, by using the patterned first photoresist 107 as a mask, contact holes 108 are formed by anisotropic dry etching under such a condition that the etching rate of the BPSG film 106 is higher than that of the silicon nitride film 105 as shown in FIG. 4C. Since the etching rate of the BPSG film 106 is higher than that of the silicon nitride film 105, formation of the contact holes 108 are stopped at the surface of the silicon nitride film 105 in this process.

Figure 4D:
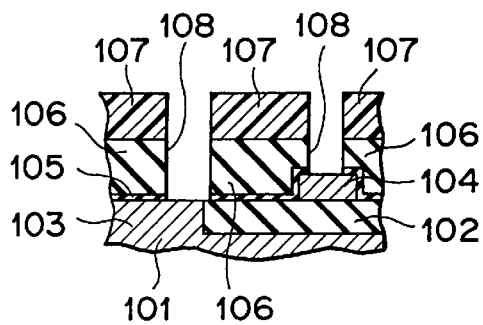

Subsequently, by using the first photoresist 107 as a mask, the silicon nitride film 105 is etched under such a condition that the etching rate of the silicon nitride film 105 is higher than that of the silicon oxide film as shown in FIG. 4D.

In this way, etching is conducted in two stages. Even if the contact hole 108 partially protrudes to the device isolation region 102, therefore, the silicon oxide film forming the device isolation region 102 is not etched. Accordingly, performance of elements is not damaged.

Etching of the BPSG film 106 is conducted by using, for example, $C_4F_8$ gas having a flow rate of 20 sccm and Ar gas having a flow rate of 580 sccm, setting the substrate temperature to 10° C., and setting the bias power to 25 W. Etching of the silicon nitride film 105 is conducted by using, for example, $CF_4$ gas having a flow rate of 20 sccm, $H_2$ gas having a flow rate of 20 sccm, and Ar gas having a flow rate of 560 sccm, setting the substrate temperature to 10° C., and setting the bias power to 25 W.

Figure 4E:
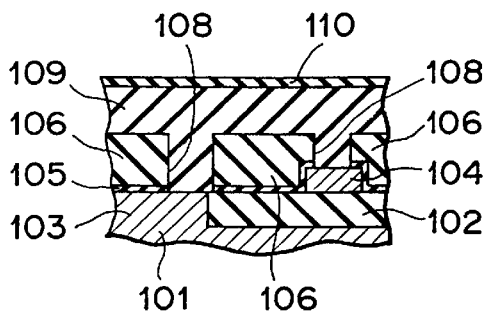

Subsequently, as shown in FIG. 4E, the first photoresist 107 is removed. Thereafter, an organic coated film (organic insulating film) 109 made of, for example, benzcyclobutene (BCB) is coated onto the whole surface so as to make the film thickness on the BPSG film 106 in a region where a contact hole 108 is not formed equal to, for example, 0.5 μm. The organic coated film 109 is then baked at 300° C. A silicon oxide film 110 having a film thickness of, for example, 2,000 Å is formed as a third insulating film on the organic coated film 109 by using the plasma CVD method.

Figure 4F:
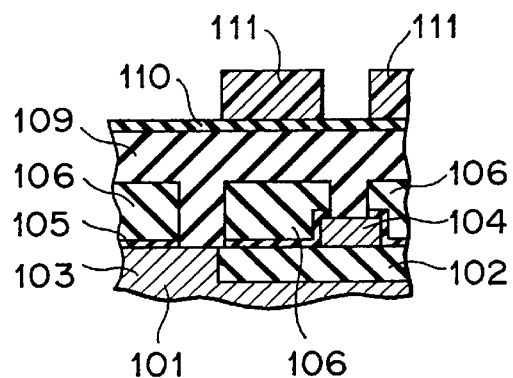

Subsequently, as shown in FIG. 4F, a second photoresist 111 is formed on the silicon oxide film 110. A pattern for wiring trench is formed in the second photoresist 111 by using the ordinary exposure method.

Figure 4G:
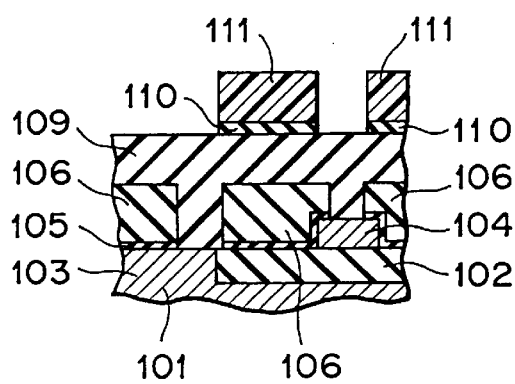

Subsequently, as shown in FIG. 4G, the silicon oxide film 110 is etched by using the patterned second photoresist 111 as a mask. This etching is conducted, for example, by using $C_4F_8$ gas having a flow rate of 20 sccm and Ar gas having a flow rate of 580 sccm, setting the substrate temperature to 10° C., and setting the bias power to 25 W.

Figure 4H:
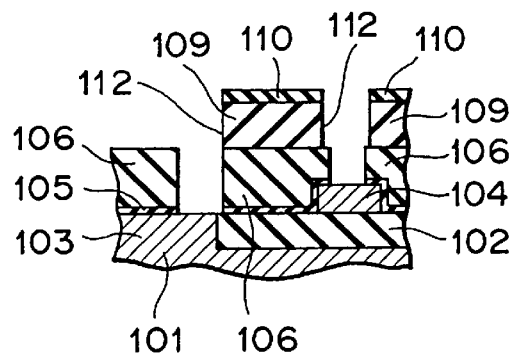

Subsequently, as shown in FIG. 4H, the organic coated film 109 is etched by using the silicon oxide film 110 as a mask. Wiring trenches 112 are thus formed. This etching is conducted, for example, by using $Cl_2$ gas having a flow rate of 150 sccm and $O_2$ gas having a flow rate of 150 sccm, setting the substrate temperature to 20° C., and setting the bias power to 25 W.

In this process, the second photoresist 111 made of a organic material is etched at the same time as the organic coated film 109. Therefore, a step for removing the second photoresist 111 is not required.

In addition, since the organic coated film 109 is significantly different in etching condition from the silicon oxide film, the etching rate of the organic coated film 109 can be adjusted to become approximately 50 times that of the silicon oxide film.

Figure 4I:
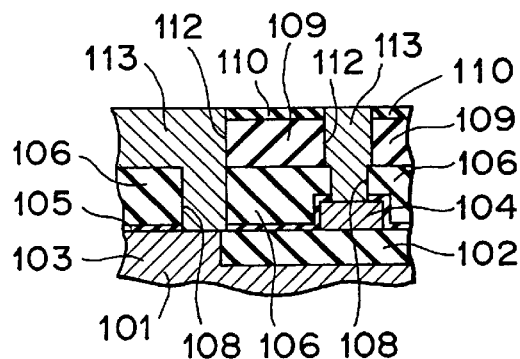

Subsequently, a barrier metal layer (not shown) made of, for example, TiN or the like and having a film thickness in the range of 500 to 1000 Å is formed on a whole surface. Furthermore, as shown in FIG. 4I, a tungsten layer 113 is formed as a conductive layer by using the CVD method. The tungsten layer 113 and the barrier metal layer formed in the regions other than insides of the contact holes 108 and insides of the wiring trenches 112 are removed by using the chemical-mechanical polishing method. As a result, wiring layers and contact plugs are formed.

According to the present embodiment, the etching of the contact holes can be completed in only two stages. In addition, since the aspect ratio is approximately the same as that of the conventional technique, the contact holes 108 can be formed with high precision.

A second embodiment of the present invention will now be described. FIGS. 5A to 5F are sectional views showing a method for manufacturing a semiconductor according to the second embodiment of the present invention in the order of process.

Figure 5A:
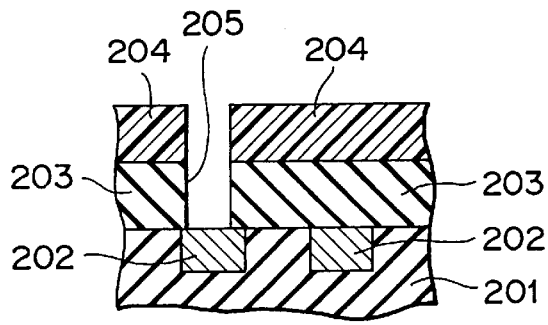
FIGS. 5A to 5F are sectional views showing a method for manufacturing a semiconductor device according to a second embodiment of the present invention in the order of process.

In the second embodiment, an Al wiring layer 202 made of aluminum or an aluminum alloy is first formed selectively at a surface of an interlayer insulating film 201 formed on a semiconductor substrate (not shown) as shown in FIG. 5A. Subsequently, a first silicon oxide film 203 having a film thickness of, for example, 0.8 μm is formed on a whole surface as a first insulating film. Furthermore, a first photoresist 204 is formed on the first silicon oxide film 203, and a pattern for via hole is formed in a first photoresist 204 by using the ordinary exposure method. By anisotropic dry etching using the patterned first photoresist 204 as a mask, the first silicon oxide film 203 is etched. As a result, a via hole 205 is formed. This etching is conducted, for example, by using $CHF_3$ gas having a flow rate of 20 sccm and Ar gas having a flow rate of 580 sccm, setting the substrate temperature to 10° C., and setting the bias power to 25 W.

Incidentally, if the Al wiring layer 202 is formed by using aluminum instead of tungsten in the first embodiment and corresponds to the tungsten layer 113, the etching of the via hole 205 is stopped at the time when a film corresponding to the silicon oxide film 110 in the first embodiment is etched. The etching in this case is conducted by using, for example, $CHF_3$ gas having a flow rate of 20 sccm and Ar gas having a flow rate of 580 sccm, setting the substrate temperature to 10° C., and setting the bias power to 25 W.

Figure 5D:
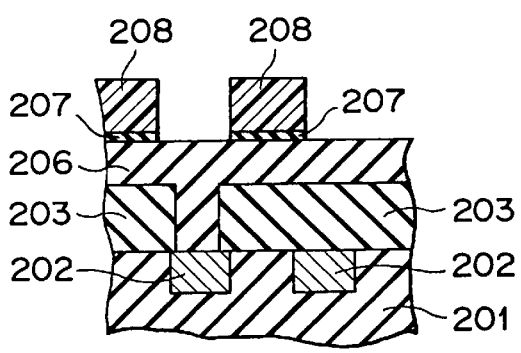
Figure 5B:
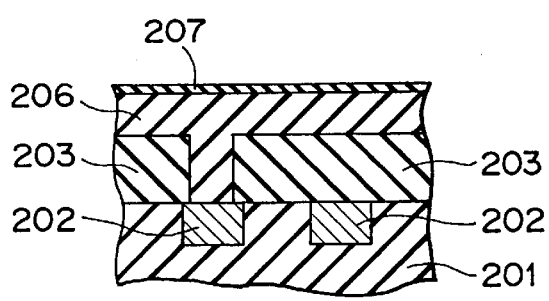

Subsequently, as shown in FIG. 5B, the first photoresist 204 is removed. Thereafter, an organic coated film (organic insulating film) 206 made of, for example, BCB is coated onto the whole surface so as to make the film thickness on the first silicon oxide film 203 in a region where the via hole 205 is not formed equal to, for example, 0.7 μm. Furthermore, a second silicon oxide film 207 is formed on the organic coated film 206 as a second insulating film by using the CVD method.

Figure 5E:
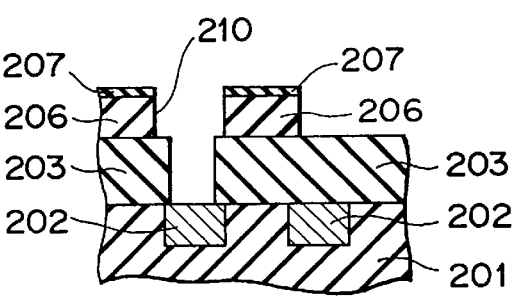
Figure 5C:
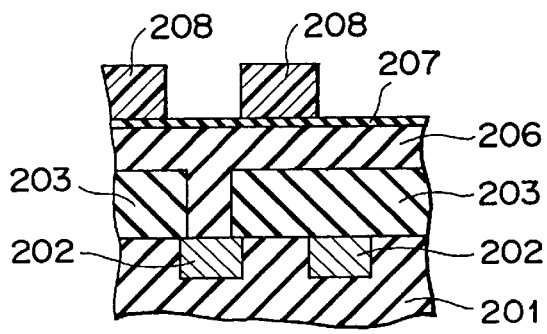

Subsequently, as shown in FIG. 5C, a second photoresist 208 is formed on the silicon oxide film 207, and a pattern for wiring trench is formed in the second photoresist 208 by using the ordinary exposure method.

Subsequently, as shown in FIG. 5D, the silicon oxide film 207 is etched by using the patterned second photoresist 208 as a mask. This etching is conducted, for example, by using $C_4F_8$ gas having a flow rate of 20 sccm and Ar gas having a flow rate of 580 sccm, setting the substrate temperature to 10° C., and setting the bias power to 25 W.

Subsequently, as shown in FIG. 5E, the organic coated film 206 is etched by using the silicon oxide film 207 as a mask. Thus, a wiring trench 210 is formed. This etching is conducted, for example, by using $Cl_2$ gas having a flow rate of 150 sccm and O₂ gas having a flow rate of 150 sccm, setting the substrate temperature to 20° C., and setting the bias power to 25 W. In this process, the second photoresist 208 is also removed simultaneously with the organic coated film 206.

Figure 5F:
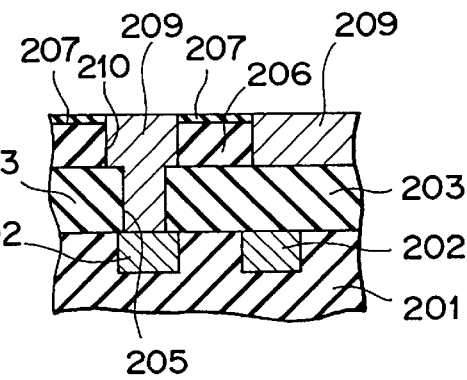

Subsequently, a barrier metal layer (not shown) made of, for example, TiN or the like and having a film thickness in the range of 500 to 1,000 Å is formed on the whole surface. Furthermore, an Al or Al alloy layer 209 is formed on the whole surface as a conductive layer by using the CVD method or a method obtained by combining the sputtering method with the reflowing method. The Al or Al alloy layer 209 and the barrier metal layer formed in regions other than inside of the via hole 205 and inside of the wiring trench 210 are removed by using the chemical-mechanical polishing method. As a result, as shown in FIG. 5F, the wiring layer and via plug are formed.

Figure 1:
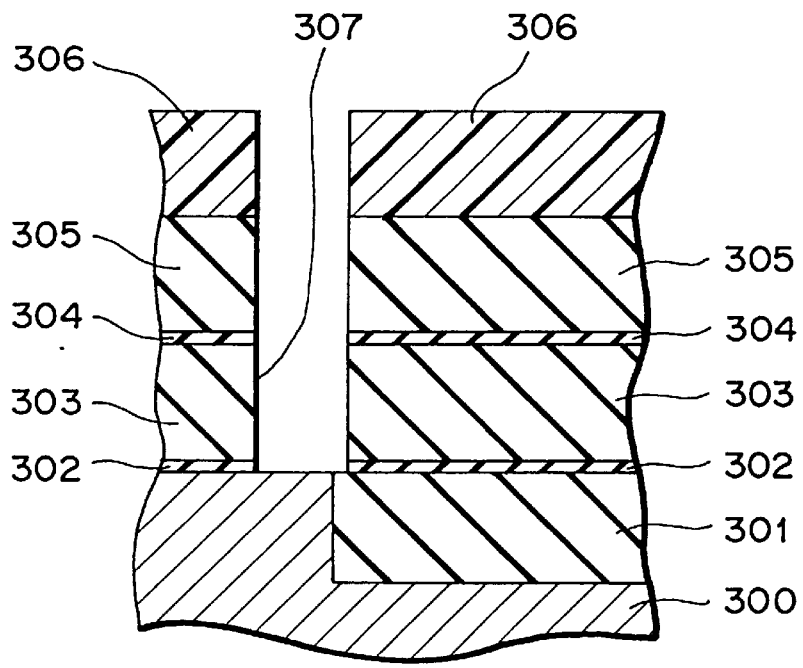
FIG. 1 is a sectional view showing a conventional semiconductor device manufacturing method using a typical dual damascene method.
Figure 2:
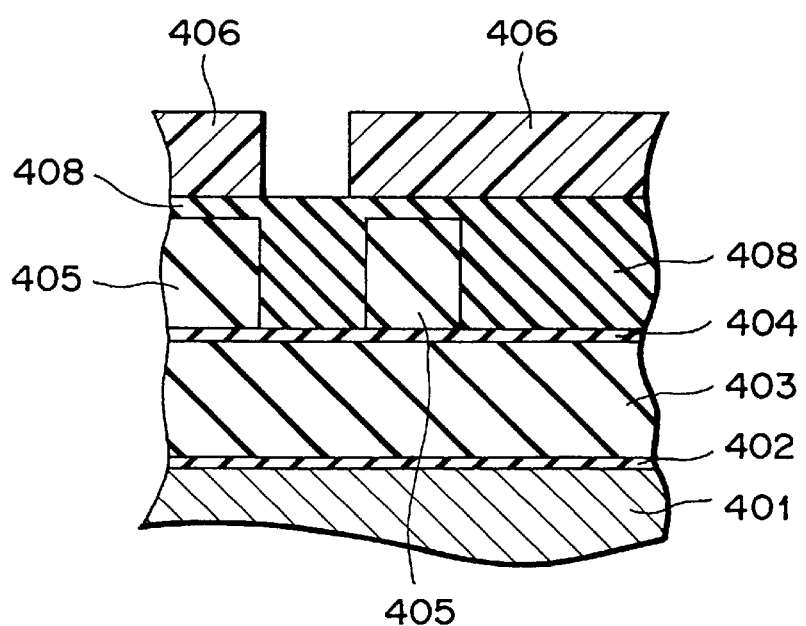
FIG. 2 is a sectional view showing a conventional semiconductor device manufacturing method using a dual damascene method disclosed in U.S. Pat. No. 4,789,648.
Figure 3A:
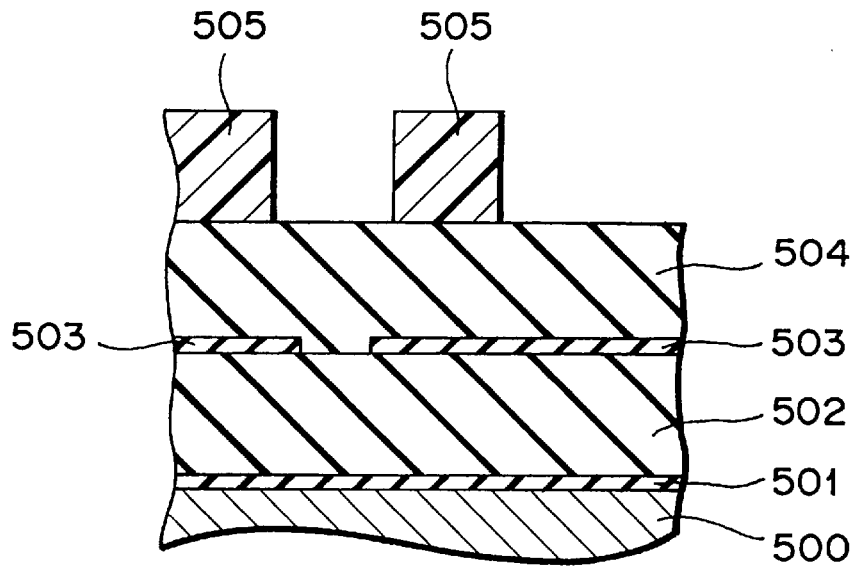
FIGS. 3A and 3B are sectional views showing a conventional semiconductor device manufacturing method using a dual damascene method disclosed in U.S. Pat. No. 4,944,836 in the order of process.
Figure 3B:
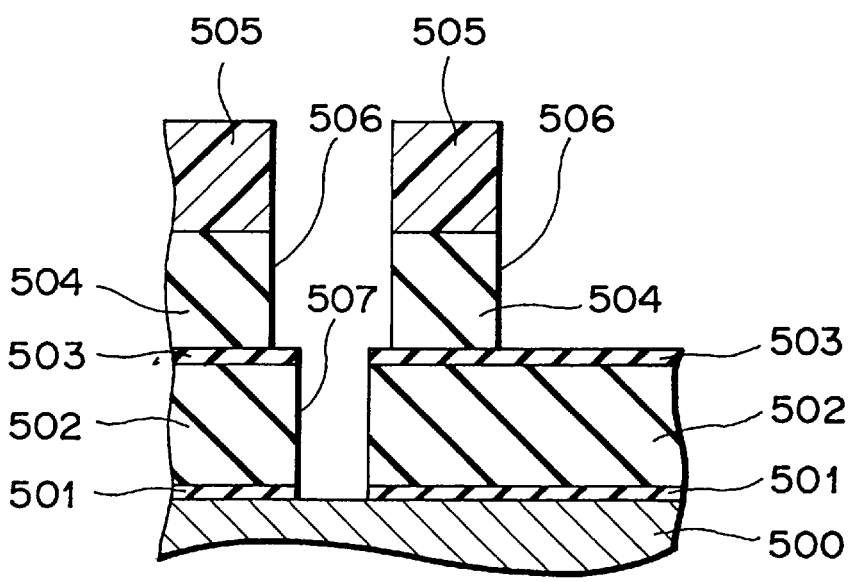

Effects of the embodiments of the present invention will now be described. Semiconductor devices for testing, each having a thirty thousand contacts connected in series between wiring layers of a multilevel metallization structure, were fabricated according to the first embodiment and the second embodiment. Such a structure is called contact chain. A voltage was applied between wiring layers located at both ends of the contact chain. By judging a semiconductor device letting no current flow to be a failure device, yield measurement was conducted. In addition, the same yield measurement was conducted for the conventional technique (comparative example 1) shown in FIG. 1 and the conventional technique (comparative example 2) shown in FIG. 2.

In addition, semiconductor devices each having a wiring interval of 0.3 μm were fabricated according to the first embodiment and the second embodiment. Parasitic capacitance between wiring layers of these semiconductor devices was measured. In addition, the same measurement of parasitic capacitance between wiring layers was conducted for the comparative example 1 and comparative example 2. Results of them are shown in FIG. 6. FIG. 6 is a graphic diagram showing measurement results of the yield and the parasitic capacitance between wiring layers of semiconductor devices fabricated by various methods. In FIG. 6, black dots indicate yields and white dots indicate the capacitance between wiring layers.

As shown in FIG. 6, the yield of the embodiments is significantly higher than that of the comparative example 1 and the comparative example 2. In addition, the parasitic capacitance between wiring layers is decreased by approximately 20%.

What is claimed is:

1. A method for manufacturing a semiconductor device having a dual damascene structure, comprising the steps of:
   forming a first insulating film on a semiconductor substrate having a device region at a surface thereof;
   forming a first photoresist on said first insulating film;
   forming a pattern for a contact hole in said first photoresist by using an exposure method;
   etching said first insulating film by using said first photoresist as a mask to form said contact hole for providing said device region with electrical conduction;
   removing said first photoresist;
   forming an organic insulating film on said first insulating film and in said contact hole;
   forming a second insulating film on said organic insulating film that is on said first insulating film and in said contact hole;
   forming a second photoresist on said second insulating film;
   forming a pattern for wiring trench in said second photoresist by using an exposure method;
   etching said second insulating film by using said second photoresist as a mask;
   etching said organic insulating film by using said second insulating film as a mask to form a wiring trench so as to leave a portion of said organic insulating film on said first insulating film; and
   embedding a conductive layer in said contact hole and said wiring trench.

2. A method for manufacturing a semiconductor device according to claim 1, wherein said step of embedding said conductive layer comprises the steps of:
   forming a conductive film on a whole surface; and
   removing selectively said conductive film to leave said conductive film in only said contact hole and said wiring trench.

3. A method for manufacturing a semiconductor device according to claim 1, wherein said step of etching said organic insulating film comprises the step of removing said second photoresist simultaneously.

4. A method for manufacturing a semiconductor device according to claim 1, wherein said step of forming said organic insulating film comprises the step of coating said organic insulating film onto a whole surface.

5. A method for manufacturing a semiconductor device according to claim 1, wherein
   said step of forming said first insulating film comprises the steps of:
      forming a third insulating film on said semiconductor substrate; and
      forming a fourth insulating film on said third insulating film,
   said first insulating film is composed of said third insulating film and said fourth insulating film, and
   said step of etching said first insulating film comprises the steps of:
      etching said fourth insulating film until a surface of said third insulating film is exposed under such a condition that the etching rate of said third insulating film is lower than that of said fourth insulating film; and
      etching said third insulating film.

6. A method for manufacturing a semiconductor device according to claim 1, wherein said organic insulating film is a benzcyclobutene film.

7. A method for manufacturing a semiconductor device according to claim 2, wherein said conductive film comprises a barrier metal film made of titanium nitride, and a tungsten film formed on said barrier metal film.

8. A method for manufacturing a semiconductor device having a dual damascene structure, said method comprising the steps of:
   forming a first insulating film on a semiconductor substrate having a device region at a surface thereof;
   forming a first photoresist on said first insulating film;
   forming a pattern for a via hole in said first photoresist by using an exposure method;
   etching said first insulating film by using said first photoresist as a mask to form said via hole for providing said device region with electrical conduction;
   removing said first photoresist;
   forming an organic insulating film on said first insulating film and in said via hole;

forming a second insulating film on said organic insulating film that is on said first insulating film and in said via hole;

forming a second photoresist on said second insulating film;

forming a pattern for a wiring trench in said second photoresist by using an exposure method;

etching said second insulating film by using said second photoresist as a mask;

etching said organic insulating film by using said second insulating film as a mask to form a wiring trench so as to leave a portion of said organic insulating film on said first insulating film; and embedding a conductive layer in said via hole and said wiring trench.

9. A method for manufacturing a semiconductor device according to claim 8, wherein said step of embedding said conductive layer comprises the steps of:

forming a conductive film on a whole surface; and removing selectively said conductive film to leave said conductive film in only said via hole and said wiring trench.

10. A method for manufacturing a semiconductor device according to claim 8, wherein said step of etching said organic insulating film comprises the step of removing said second photoresist simultaneously.

11. A method for manufacturing a semiconductor device according to claim 8, wherein said step of forming said organic insulating film comprises the step of coating said organic insulating film onto a whole surface.

12. A method for manufacturing a semiconductor device according to claim 8, wherein said organic insulating film is a benzcyclobutene film.

13. A method for manufacturing a semiconductor device according to claim 9, wherein said conductive film comprises a barrier metal film made of titanium nitride, and an aluminum or aluminum alloy film formed on said barrier metal.

14. A method for manufacturing a semiconductor device having a dual damascene structure, comprising the steps of:

forming contact holes in a first insulating film communicating with a device layer;

applying an organic film over said first insulating film and in said contact holes;

forming a second insulating film on said organic film immediately following said applying an organic film step;

etching through a photomask on said second insulating film to expose a surface of said organic film;

etching through said organic film to form wiring trenches, wherein each wiring trench is in registration with one of said contact holes;

removing the photomask during said etching through said organic film step;

filling said contact holes and said wiring trenches with a conductive material to form contact plugs and wiring layers; and controlling a parasitic capacitance between an adjacent pair of said wiring layers by leaving said organic film on said first insulating film between said adjacent pair of said wiring layers.

15. The method of claim 14, wherein said organic film is a BCB film.

16. The method of claim 14, wherein said etching through a photomask step comprises etching having a different selectivity for said second insulating film than for said organic film.

* * * * *